United States Patent
Tian et al.

(10) Patent No.: US 8,640,061 B2
(45) Date of Patent: Jan. 28, 2014

(54) AUTOMATED CIRCUIT DESIGN

(71) Applicant: Synopsys, Inc., Mountain View, CA (US)

(72) Inventors: Bing Tian, San Jose, CA (US); Kenneth S. McElvain, Los Altos, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/652,425

(22) Filed: Oct. 15, 2012

(65) Prior Publication Data

US 2013/0042215 A1 Feb. 14, 2013

Related U.S. Application Data

(62) Division of application No. 12/580,796, filed on Oct. 16, 2009, now Pat. No. 8,291,356, which is a division of application No. 10/958,899, filed on Oct. 4, 2004, now Pat. No. 7,620,917.

(51) Int. Cl.
*G06F 17/50* (2006.01)

(52) U.S. Cl.
USPC .......................................... 716/101

(58) Field of Classification Search
USPC ............................... 716/100, 101
See application file for complete search history.

(56) References Cited

U.S. PATENT DOCUMENTS

| | | | |
|---|---|---|---|
| 5,519,351 A | 5/1996 | Matsumoto et al. | |
| 5,631,576 A | 5/1997 | Lee et al. | |
| 5,751,998 A * | 5/1998 | Wunderlich et al. | 711/163 |
| 5,815,726 A | 9/1998 | Cliff et al. | |
| 5,889,411 A | 3/1999 | Chaudhary | |
| 5,898,602 A | 4/1999 | Rothman et al. | |
| 5,940,850 A * | 8/1999 | Harish et al. | 711/102 |
| 6,009,522 A | 12/1999 | Klein et al. | |
| 6,020,774 A | 2/2000 | Chiu et al. | |
| 6,154,053 A | 11/2000 | New | |
| 6,353,920 B1 | 3/2002 | Wittig et al. | |
| 6,359,469 B1 | 3/2002 | Mendel et al. | |
| 6,421,818 B1 | 7/2002 | Dupenloup et al. | |
| 6,427,156 B1 | 7/2002 | Chapman et al. | |
| 6,442,660 B1 * | 8/2002 | Henerlau et al. | 711/165 |
| 6,466,052 B1 | 10/2002 | Kaviani | |
| 6,476,634 B1 | 11/2002 | Bilski | |
| 6,505,337 B1 | 1/2003 | Wittig et al. | |
| 6,603,332 B2 | 8/2003 | Kaviani et al. | |
| 6,708,191 B2 | 3/2004 | Chapman et al. | |

(Continued)

OTHER PUBLICATIONS

PCT Invitation to Pay Additional Fees for PCT International Appln. No. US2005/035585, mailed Feb. 10, 2006 (5 pages).

(Continued)

*Primary Examiner* — Suchin Parihar
(74) *Attorney, Agent, or Firm* — Blakely, Sokoloff, Taylor & Zafman LLP; Judith A. Szepesi

(57) ABSTRACT

Methods and apparatuses to automatically synthesize circuits. In one aspect of an embodiment, a method implemented on a data processing system for circuit synthesis comprises determining a Read Only Memory (ROM) of a design of a circuit, the ROM having predefined data when the circuit is initialized, and automatically generating an initialization circuit and a Random Access Memory (RAM) to implement the ROM, the initialization circuit to load the predefined data into the RAM when the circuit is initialized.

17 Claims, 15 Drawing Sheets

(56) References Cited

U.S. PATENT DOCUMENTS

| | | |
|---|---|---|
| 6,807,556 B1 | 10/2004 | McElvain |
| 6,833,730 B1 | 12/2004 | Ganesan et al. |
| 7,051,296 B1 | 5/2006 | McElvain |
| 7,443,318 B2 * | 10/2008 | Hung et al. ............. 341/51 |
| 8,412,918 B1 * | 4/2013 | Allen et al. ............ 713/1 |
| 8,429,634 B2 * | 4/2013 | Dembo et al. ............ 717/153 |
| 2001/0030555 A1 | 10/2001 | Wittig et al. |
| 2002/0023206 A1 | 2/2002 | Klein |
| 2002/0079921 A1 | 6/2002 | Kaviani et al. |
| 2002/0125910 A1 | 9/2002 | New et al. |
| 2002/0178431 A1 | 11/2002 | Chapman et al. |
| 2003/0033584 A1 * | 2/2003 | Zaveri et al. ............ 716/17 |
| 2004/0078766 A1 | 4/2004 | Andreev et al. |
| 2005/0027940 A1 * | 2/2005 | Zimmer et al. ............ 711/117 |
| 2005/0132316 A1 | 6/2005 | Suaris et al. |
| 2006/0004997 A1 | 1/2006 | Mykland |
| 2006/0053401 A1 * | 3/2006 | McElvain et al. ............ 716/11 |
| 2007/0152707 A1 * | 7/2007 | Madurawe ............ 326/38 |
| 2008/0288899 A1 | 11/2008 | McElvain et al. |
| 2010/0013517 A1 | 1/2010 | Manohar et al. |
| 2010/0060309 A1 | 3/2010 | Lewis |

OTHER PUBLICATIONS

PCT International Search Report and Written Opinion for PCT International Appln. No. US2005/035585, mailed May 2, 2006 (18 pages).

PCT International Preliminary Report and Written Opinion for PCT International Appln. No. US2005/035585, mailed Apr. 19, 2007, (12 pages).

Slade et al., "Reconfigurable Computing Application Frameworks", Field-Programmable Custom Computing Machines, 2003. FCCM 2003. 11th Annual IEEE Symposium on Apr. 9-11, 2003, pp. 251-260.

\* cited by examiner

AUTOMATED CIRCUIT DESIGN

This application is a divisional application of U.S. patent application Ser. No. 12/580,796 filed on Oct. 16, 2009, now U.S. Pat. No. 8,291,356 issuing on Oct. 16, 2012, which is divisional application of U.S. patent application Ser. No. 10/958,899 filed on Oct. 4, 2004, now U.S. Pat. No. 7,620,917 issued on Nov. 17, 2009.

FIELD OF THE TECHNOLOGY

The invention relates to automated circuit design, and more particularly to the synthesis of a design of a circuit.

BACKGROUND

For the design of digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. VHDL and Verilog are general-purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist, which can be used to create circuits in the vendor's technology/architecture. It is well known that FPGA vendors utilize different technology/architecture to implement logic circuits within their integrated circuits. Thus, the technology independent RTL netlist is mapped to create a netlist, which is specific to a particular vendor's technology/architecture.

One operation, which is often desirable in this process, is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then assigns logic to reside in a block. These regions may be rectangular or non-rectangular. This operation has two effects: the estimation error for the location of the logic is reduced from the size of the integrated circuit to the size of the block (which tends to reduce errors in timing estimates), and the placement and routing typically runs faster because as it has been reduced from one very large problem into a series of simpler problems.

After the synthesis transformation, the placement and routing is performed to generate a technology/architecture dependent design layout, which can be implemented on a vendor's technology/architecture dependent integrated circuit, such as field programmable gate arrays (FPGA) or an application-specific integrated circuit (ASIC).

SUMMARY OF THE DESCRIPTION

Methods and apparatuses to automatically synthesize circuits are described here. Some embodiments are summarized in this section.

In one aspect of an embodiment, a logic function feeding a carry chain is implemented through extending the carry chain and through using the extended portion of the carry chain. In one aspect of an embodiment, control/non-control loads are separated from each other through replicating the driver elements of the mixed control/non-control loads. In one aspect of an embodiment, a read only memory (ROM) is implemented using a random access memory (RAM). In one embodiment, a register at the input side of the ROM is generated through inserting a register that is clocked at an inverted clock signal or through retiming a register from the output side of the ROM.

In one aspect of an embodiment, a method implemented on a data processing system for circuit synthesis, includes: determining a portion of a circuit design which includes a logic function generating an input for a carry chain; and extending the carry chain to implement the logic function using an extended portion of the carry chain. In one example, the carry chain includes a chain of multiplexers for a carry chain adder; the logic function is implemented using a plurality of field programmable gate arrays (FPGA) blocks (e.g., lookup tables), each of the blocks generating an output feeding into the extended portion of the carry chain; and the output of each of the blocks controls a selection line of a corresponding one of the multiplexers. In one example, extending the carry chain includes: splitting the logic function into a first logic function and second logic function combined using a stage of the extended portion of the carry chain. In one example, each stage of the extended portion of the carry chain includes a multiplexer; the first logic function is implemented using a look up table unit; the circuit design is implemented using field programmable gate arrays (FPGA); and the circuit design is in a form of a hardware design language (HDL).

In one aspect of an embodiment, a method implemented on a data processing system for circuit synthesis, includes: determining a net of a circuit design which drives one or more control loads (e.g., clock, reset, and set) and one or more non-control loads; and splitting the net into a first net and a second net, where the first net drives the one or more control loads but no non-control load and the second net drives the one or more non-control loads but no control load. In one example, splitting the net includes: replicating a driver element of the net to have a first and second instances of the driver element, where the first instance of the driver element drives the first net and the second instance of the driver element drives the second net. In one example, splitting the net includes: locating a replication of a driver element of the net; and configuring the driver element and the replication of the driver to drive the first and second nets separately. In one example, the control loads and non-control loads use different routing resources in implementing the circuit design.

In one aspect of an embodiment, a method implemented on a data processing system for circuit synthesis, includes: determining a Read Only Memory (ROM) of a design of a circuit, the ROM having predefined data when the circuit is initialized; and automatically generating an initialization circuit and a Random Access Memory (RAM) to implement the ROM, where the initialization circuit is to load the predefined data into the RAM when the circuit is initialized. In one example, a first register is automatically inserted at an input side of the ROM responsive to a determination that the ROM is between second and third registers, where no register exists on a path between the second and third registers before the first register is inserted, the second and third registers latch data on a same edge of a clock signal, and the first and second registers latch data on different edges of the clock signal. In one example, the first register and the ROM are implemented using the RAM. In another example, a first register is removed from an output side of the ROM and a second register inserted to an input side of the ROM; and the second register and the ROM are implemented using the RAM. In one example, the first register outputs a first data entry upon reset; and the method further includes: identifying an address in the ROM; and configuring the second register to generate the address upon reset. In one example, a data item at the address in the ROM is the same as the first data entry. In one example, the predefined data does not include the data item; the method further includes: configuring the ROM to include the data item. In one example, the data item at the address in the ROM is approximately the same as the first data entry; and the method further includes: generating a circuit to correct the data item to the first data entry when the circuit is initialized. In one example, the second register generates a predefined value upon reset; the first register outputs a first data entry upon reset; and the method further includes: identifying a first address in the ROM, predefined data in the ROM having a second data entry at the first address; generating an address mapping circuit at an input side of the first register, where the address mapping circuit maps the first address to the predefined value; and rearranging the predefined data within the ROM according to the address mapping circuit, where the second data entry is at an address of the predefined value in the rearranged predefined data in the ROM. In one example, the second data entry is equal to the first data entry. In another example, the second data entry is approximately equal to the first data entry; and the method further includes: generating a circuit to correct the second data entry to the first data entry when the circuit is initialized. In one example, the initialization circuit includes a state machine to drive a circuit to generate the predefined data. In another example, the initialization circuit loads instructions to cause a processor to compute the predefined data for populating the RAM when the circuit is initialized.

The present invention includes methods and apparatuses which perform these methods, including data processing systems which perform these methods, computer readable media which when executed on data processing systems cause the systems to perform these methods, circuits designed using these methods, and computer readable media which contains the data representation of the circuits designed using these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

One embodiment of the present invention seeks to speed up the path passing through a carry chain. For example, if the carry chain's carry input is fed by a logic gate and it is a critical input in timing, the gate logic is then converted to use additional elements in the carry chain. One implementation of a synthesis software tool looks for a critical carry chain whose carry input is a logic function, for example, a lookup table (LUT). To speed up the critical carry chain, the synthesis software tool adds one or more stages of carry to implement the logic function.

Figure 1:
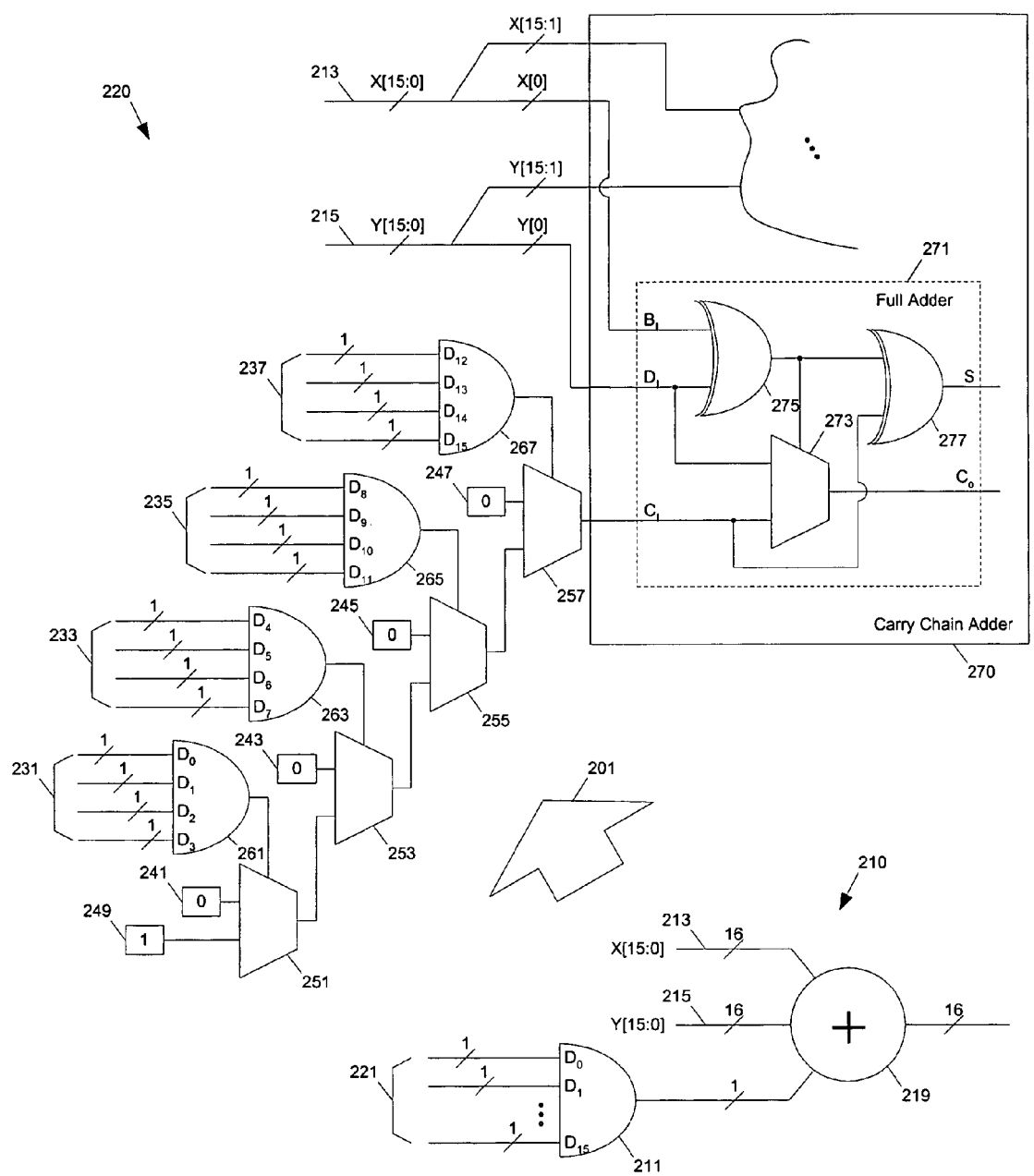
FIG. 1 illustrates a synthesis transformation to implement a logic function using an extended carry chain according to one embodiment of the present invention.

FIG. 1 illustrates a synthesis transformation to implement a logic function using an extended carry chain according to one embodiment of the present invention. In FIG. 1, the synthesis software tool implements the circuit design 210, which has a critical path passing through the AND gate 211 and the carry chain of adder 219 to the output of the adder 219.

The adder 219 adds input data X[15:0] (213) and Y[15:0] (215) with a carry in from the output of the AND gate 211 to generate an output.

In one embodiment of the present invention, the carry chain is extended several more stages to implement the AND function to speed up the circuit, as illustrated in the design 220 obtained through the synthesis transformation 201.

In the circuit design 220, the full adder 271 has the first stage of carry chain for the carry chain adder 270. The full adder 271 is implemented using XOR gates 275 and 277 and a multiplexer 273. The full adder 271 adds carry in $C_I$ and bits X[0] and Y[0] of inputs X[15:0] (213) and Y[15:0] (215) to produce the sum S for the corresponding bit and the carry out $C_o$. The multiplexer 273 receives carry in ($C_I$) to produce carry out ($C_o$) according to the output of the XOR gate 275.

In the circuit design 220, the carry chain of the adder 270 is extended to have input stages 251-257 to implement the AND gate (211). The AND gate is implemented as logic functions (261-267) combined by the extended carry chain (251-257). For example, in one architecture of an integrated circuit, a four-input AND gate can be implemented using a four-input lookup table (LUT). Thus, each of the AND functions (261-267) can be implemented using a four-input LUT. The output of the LUTs controls the multiplexers (251-257) to select 0 (241-247) or the result of the previous stage. For example, when the result of logic function 261 is 0, the multiplexer 251 outputs zero according to the value (241); when the result of logic function 261 is 1, the multiplexer 251 outputs one according to the value 249. It is understood that in the example of FIG. 1, the stage of multiplexer 251 can be eliminated, since the output of the logic function 261 can be directly connected to the input of multiplexer 253.

Thus, in FIG. 1, logic functions 261-267 together with the extended portion of the carry chain (251-257) implement the original logic function 211. Although the original logic function 211 can be implemented using a tree of LUTs (e.g., using a LUT to combine the outputs of functions 261-267 without using the extended carry chain (251-257), such a tree of LUTs adds additional levels of LUT delay and the routing delay for the signal propagate from the output of an LUT to the carry in input. For example, in one IC architecture, the routing delay from the output of an LUT to the carry in input is approximately 0.5 ns. However, the propagation from the output of an LUT to the selection of the multiplexer takes only 0.1 ns; and the propagation from the output of one stage of a carry chain to another takes only 0.04 ns. Thus, the propagation through the extended carry chain is much faster than using a tree of LUTs. An implementation in a tree of LUTs will have the delay of two levels of LUT plus two routing delay. Propagation delay of one LUT is about 0.3 ns. One routing delay can be 0.5 ns on average. It totals to 1.6 ns. An implementation using the expanded carry chain will have the propagation delay from the input of a LUT to the output of a multiplexer which is about 0.7 ns. Plus three stages of MUXCY propagation delay each stage is around 0.04 ns. It totals to about 0.82 ns. Thus, by extending the carry chain, the additional LUT delay and the routing delay to the additional LUT are eliminated. This example of LUTs and multiplexer based carry chain illustrates the advantage for a specific FPGA. In general, the difference in delays between general logic and the carry chain can be large. One embodiment of the present invention uses the carry chain to implement the logic and to reduce the delays.

In general, there is no requirement that a carry chain be formed of multiplexors. This technique can be applied to any embedded carry chain structure that can build an adder. An adder stage has inputs a(i), b(i), and cin. When a(i) and b(i) are both set to 1, the adder stage produces a carry out of 1; when both a(i) and b(i) are set to 0, the adder stage produces a carry out of 0; when a(i) and b(i) are set to different values, the carry in is passed to the carry out. One embodiment of the present invention uses the logic function of the carry chain operation to implement a given logic, such as an AND gate, and OR gate, etc.

For example, to merge an OR function of 8 inputs x[7:0] driving the carry in, four-input functions can be used to implement $O_1=(x[0]|x[1]|x[2]|x[3])$ and $O_2=(x[4]|x[5]|x[6]|x[7])$. A carry chain can then be used to combine the results $O_1$ and $O_2$ to generate the OR(x[7:0]). When b(i) of an adder stage is set to 1, the carry out of the adder stage produces (a(i)|cin); when b(i) of an adder stage is set to 0, the carry out of the adder stage produces (a(i) & cin). Thus, an adder stage can be used to take inputs $O_1$, 1 and $O_2$ on a(i), b(i), and cin respectively to produce a carry out of $(O_1|O_2)$=OR(x[7:0]). Alternatively, an adder stage 0 having inputs a(0), b(0) and cin can be set to $O_1$, 1 and 0 respectively; the carry out of the adder stage 0 connects to the cin of the adder stage 1, which has inputs a(1) and b(0) being set to $O_1$ and 1 respectively. Thus, the adder stage 1 outputs a carry out of $(0|O_1|O_2)$=OR(x[7:0]).

It is understood that it is not necessary to break down the original logic function into four-input functions. When functions with smaller or larger numbers of inputs are used, more or less carry chain stages can be used. Further, in general, it is not necessary to use the same functions to provide inputs to the carry chain; and different stages of the carry chain can be use to perform different logic operations. In general, a large logic function can be broken down into smaller logic functions combined with a chain of logic operations, such as AND or OR, which can be implemented using a carry chain.

Although FIG. 1 illustrates the implementation of an AND gate using an extended carry chain, from this description, it is understood that other logic functions (e.g., an OR gate) can also be similarly implemented using an extended carry chain (and blocks of LUTs). When the critical path is speeded up, the performance of the circuit design is increased.

One embodiment of the present invention seeks clock/control purification. In at least some IC architectures, the control signals (e.g., clock, reset, set, etc.) and non-control signals are typically routed using different resources. When a net that has mixed loads (e.g., driving control signals and non-control signals), the net may not be routed to achieve optimal performance for both the control signals and the non-control signals. For example, FPGAs often have specialized routing resources for routing to certain types of inputs. These special inputs can include for instance: clocks, set and reset signals, register enables, high fanout multiplexer select lines. Other uses of special routing may occur. When input types are mixed on the same net, the routing delays for some of the input types may be degraded. One embodiment of the present invention improves the performance by separating them. When the routing is optimized for the control signals, the performance of the non-control signals may be degraded; when the routing is optimized for the non-control signals, the performance of the control signals may be degraded. For example, if the clock net also drives load of logic gates, that means when the circuit is implemented on the FPGA device, the clock signal needs to be taped out of the clock network at some point. Tapping the clock signal out of the clock network hurts performance, because the clock network can only be tapped at some certain points on the device, that may creates problem for routing the tapped signal to the load of logic.

In one embodiment of the present invention, a synthesis transformation is performed to separate the control signals from the non-control signals. In one implementation, a synthesis tool automatically separates clock and non-clock loads and control (e.g., reset/set) and non control loads to facilitate the backend to place and route the circuit. The synthesis tool analyzes the clock/control (set/reset) net to find loads of register clock/control pins and loads of logic gates and creates separate driver to drive the loads of logic gates. The load of clock and the load of logic will be separated with different drivers. For example, by driving the load of logic with a separate driver, there is no need to tap the clock network. In one embodiment, global clock buffer (for example BUFG) is inferred for clock net. Separating the load of clock and logic will help the performance of the circuit implemented on the device.

Figure 2:
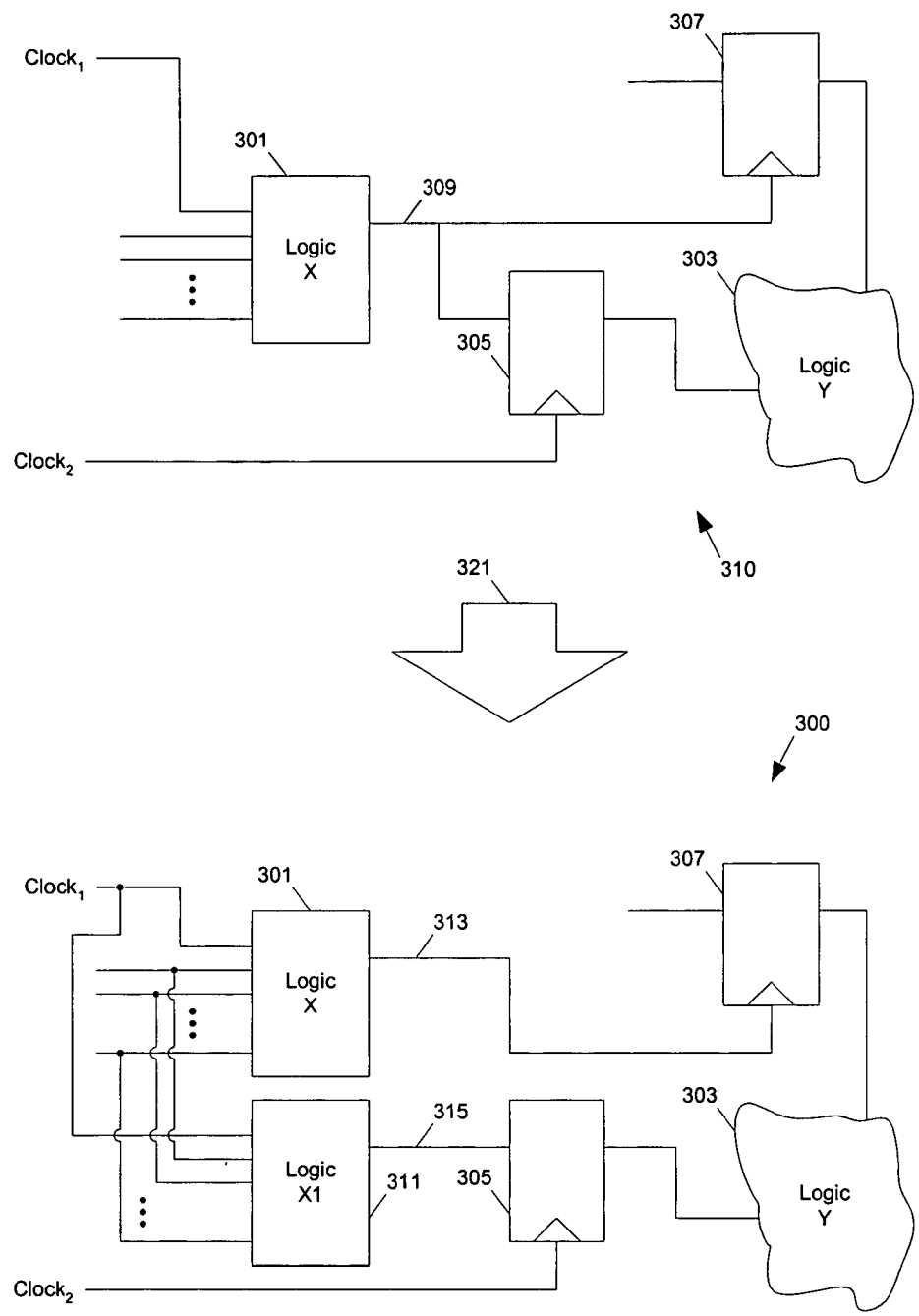
FIG. 2 illustrates a synthesis transformation to purify clock signals according to one embodiment of the present invention.

FIG. 2 illustrates a synthesis transformation to purify clock signals according to one embodiment of the present invention. In FIG. 2, the initial circuit design 310 includes a net (309) which drives both a clock load for the register 307 and a non-clock load for the register 305 and logic Y (303). In one embodiment of the present invention, a synthesis tool determines that the net (309) has mixed clock/non-clock loads. To purify the net, transformation 321 is applied to generate the circuit design 300, which has a replicated instance (311) of the driver element 301. The driver element is replicated to have two instances (301 and 311), each of which drives only one types of signal. For example, the instance 301 drives only the clock load; and the instance 311 drives only the non-clock load. Thus, the original mixed net 309 is split into two purified nets (313 and 315) to facilitate the backend to place and route the circuit with improved performance.

In FIG. 2, the driver element is replicated to purify the net. However, if a replicated version already exists, the synthesis tool can simply split the loads between these instances of the driver element.

One embodiment of the present invention seeks to implement a Read Only Memory (ROM) using a Random Access Memory (RAM) based on an IC architecture. In one implementation, a synthesis software tool maps a ROM/RAM to a block RAM. The ROM/RAM may be mapped to distributed ROM/RAM. However, mapping the ROM/RAM to distributed ROM/RAM may use a lot of logic resource on the device. Implementing ROM/RAM using a block RAM saves the logic resources.

Figure 3:
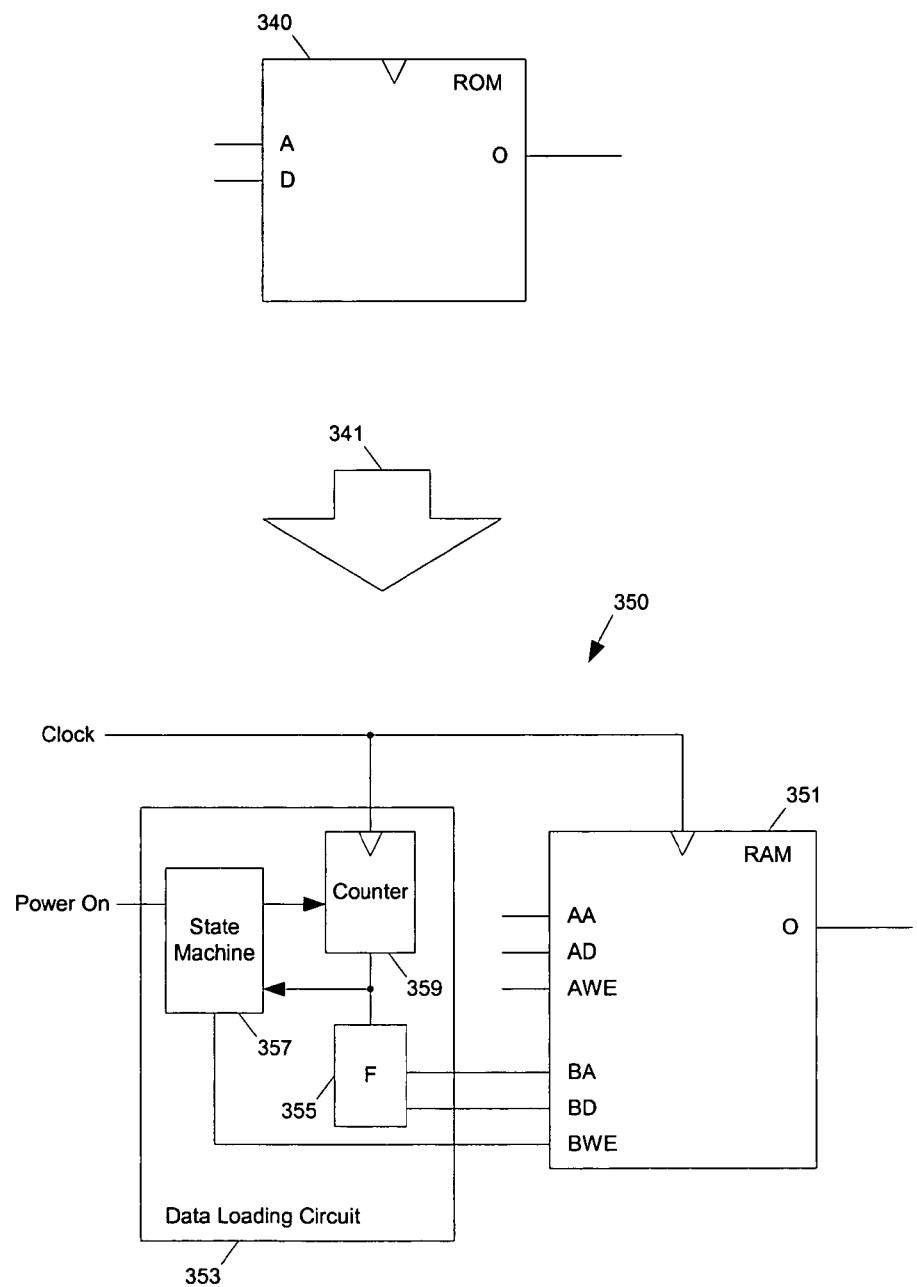
FIG. 3 illustrates a transformation to implement a Read Only Memory (ROM) using a Random Access Memory (RAM) according to one embodiment of the present invention.

FIG. 3 illustrates a transformation to implement a Read Only Memory (ROM) using a Random Access Memory (RAM) according to one embodiment of the present invention. In FIG. 3, the synthesis transformation 341 implements the ROM (340) using a RAM 351 and a data loading circuit 353. In one implementation of the transformed circuit design 350, the data loading circuit 353 is triggered by a power on signal (or a reset signal). The data loading circuit includes a state machine 357 and a counter 359 to step through all the addresses for the ROM (340) and cause the logic Function 355 to generate the corresponding data entries so that the data entries for the ROM are stored into the RAM 351 in response to the power on signal. The data loading circuit can be implemented entirely using hardware, or partially using hardware and partially using software. For example, the data of the ROM may be a look up table for a mathematical function (e.g., sin). A hardware circuit may be used to generate the values for the data of the ROM; alternatively, the data loading circuit may include software instructions which cause a process to compute the data and load the data into the RAM 351.

A faster circuitry typically takes a larger area on an IC than a functionally equivalent but slower circuitry. It may be tolerable to have a slow but small circuitry to generate and load the data during an initialization period. Thus, the data loading circuit will be smaller than a circuit to compute result at the full speed. Further, the RAM as a look up table is typically faster than a full speed computation circuit.

In at least some IC architectures, a register at the input side of the ROM/RAM is needed to pack the register and the ROM into a block RAM.

In one embodiment, if there is no register next to a ROM/RAM, but there are registers on the input path and output path of the ROM/RAM, a register controlled by an inverted clock is inserted in front of the ROM/RAM so it can be mapped to a block RAM. In one implementation, a synthesis software tool looks on the input and output paths of the ROM/RAM to find registers. If the registers on the input and output paths share the same clock (e.g., latching data on the same edge of the clock), the synthesis software tool then inserts a register with an inverted clock (e.g., latching data on a different edge of the clock) in front of the ROM/RAM. The inserted register and the ROM/RAM can them be mapped into a block RAM.

Figure 4:
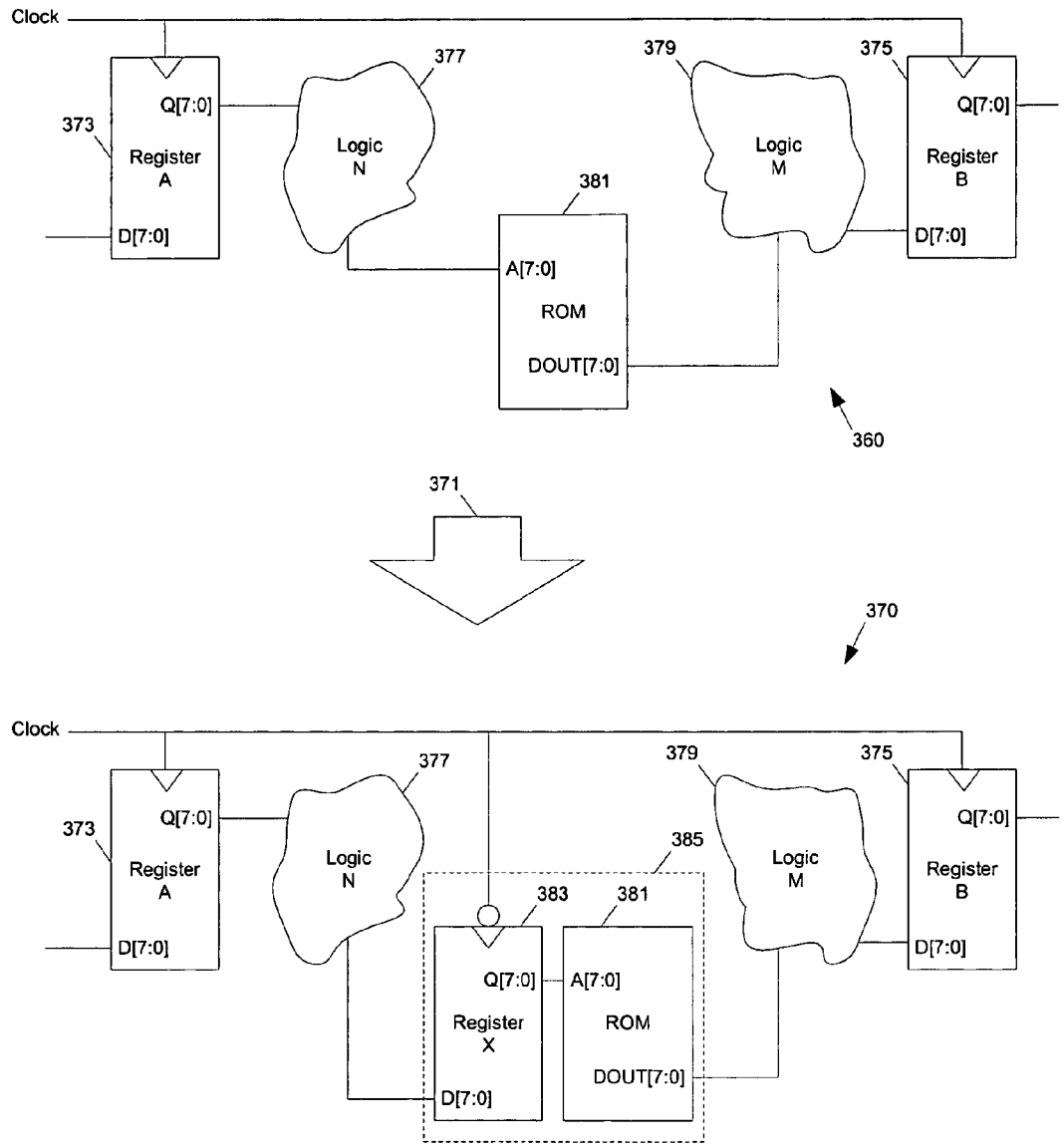
FIG. 4 illustrates a transformation to insert a register before a Read Only Memory (ROM) according to one embodiment of the present invention.

FIG. 4 illustrates a transformation to insert a register before a Read Only Memory (ROM) according to one embodiment of the present invention. In the original circuit design 360, registers 373 and 375 are on the same clock. Registers 373 and 375 latch data on the same edge of the clock (e.g., the rising edge). There is no other register on the path from the register 373, through logic 377 and logic 379, to the register 375. The ROM 381 on the path does not have any register next to it. In one embodiment, the synthesis transformation 371 inserts a register 383, which is controlled by the inverted clock. Thus, if registers 373 and 375 latch data on the rising edge, the register 383 latches data on the falling edge between the subsequent rising edges. If the signal propagates from the register 373 to the register 383 between the rising edge and the falling edge (e.g., within the first half of the clock cycle) and from the register 383 to the register 375 between the falling edge and the next rising edge (e.g., the second half of the clock cycle), the inserted register 383 does not change the behavior of the circuit (e.g., the signal propagates from the register 373 to the register 375 in one clock cycle). The synthesis transformation (371) enables the packing of the inserted register (383) and the ROM (383) into a block RAM.

One embodiment of the present invention seeks to retime an asynchronous reset register from the ROM output to the ROM input. After the register is retimed to the input side, the register can be packed with the ROM and transformed into a block RAM. In retiming the register from the ROM output to the ROM input, the synthesis tool performs operations to cause the ROM to generate the same reset value of the original register after the register is retimed to the ROM input. For example, if the register generates a word of all zeros upon asynchronous reset, the synthesis tool finds a word of all zeros in the ROM, or an unused space in the ROM which can be loaded with a word of all zeros; and the register is configured to reset to the address of the word of all zeros. If no word of all zeros exists in the ROM, an approximate word with almost all zeros in the ROM can be addressed using the reset value of the register on the ROM input. Then, a logic function is built to correct the approximate word to the word of all zeros when the retimed input register is reset. When the retimed register cannot be configured to output an arbitrary reset value (e.g., can only generate a reset value of all zeros), an address mapping circuit can be further inserted in front of the retimed register. The address mapping circuit maps the address of the data entry to the reset value of the retimed register (e.g., all zeros). Since the address mapping circuit maps the original addresses to the new addresses, the data items in the ROM are rearranged according to the new addresses so that the address mapping circuit and the rearranged ROM function as the original ROM. Detailed examples are provided below.

Figure 5:
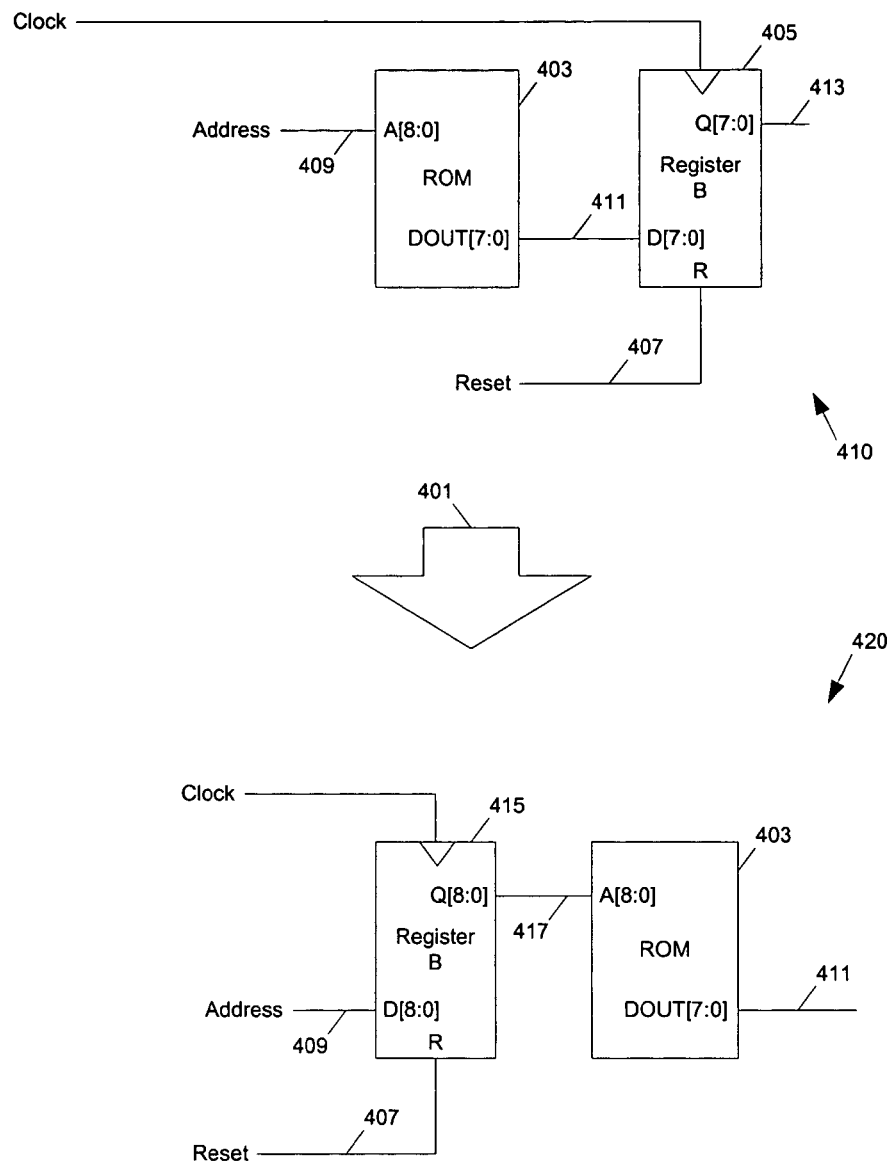
FIG. 5 illustrates a transformation to retime a register across a Read Only Memory (ROM) according to one embodiment of the present invention.

FIG. 5 illustrates a transformation to retime a register across a Read Only Memory (ROM) according to one embodiment of the present invention. In FIG. 5, the synthesis transformation 401 retimes the register 405 from the output side (411) of the ROM 403 to the input side (409) of the ROM 403. In the original design, the register 405 generates a reset value on the net 413 responsive to a reset signal on line 407. The transformed circuit 420 has the register 415 at the input side (417) of the ROM 403. To cause the ROM outputs the same reset value that the register 405 outputs, the register 415 is configured to generate the address for the same data item in ROM upon reset. For example, if register 405 outputs an eight-bit binary data 00000000 upon reset and the ROM has the eight-bit binary data 00000000 at the nine-bit address 010110010, register 415 is configure to generate the nine-bit address 010110010 when the reset signal on line 407 is on.

When the original ROM does not have the data item 00000000 but has an unused slot, the ROM can be modified to include the data item 00000000. Typically, a block of ROM on a particular architecture has a predefined size. An unused slot can be configured to have the data item for generating the reset value without any penalty.

Figure 6:
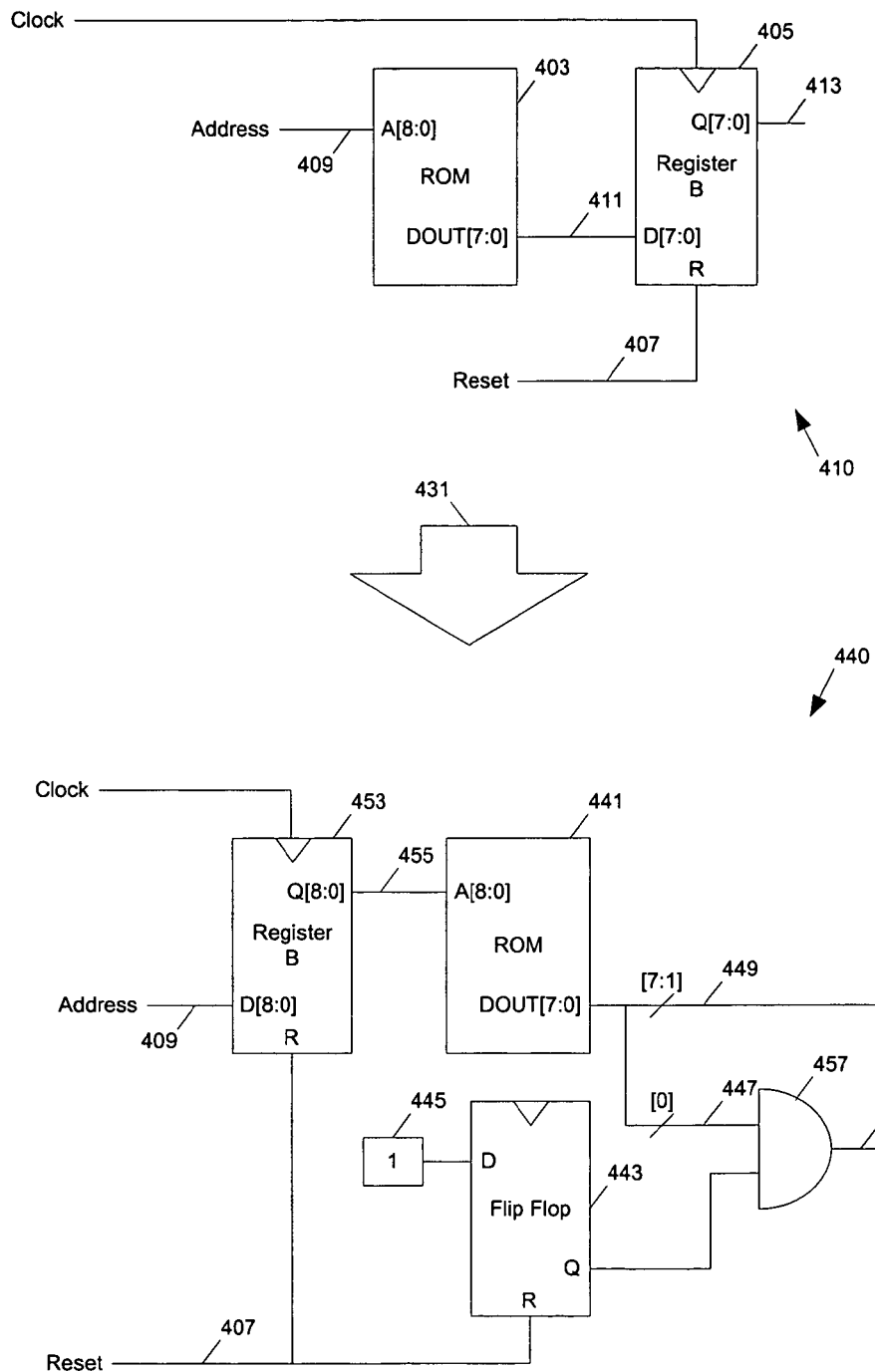
FIG. 6 illustrates another transformation to retime a register across a Read Only Memory (ROM) according to one embodiment of the present invention.

When the ROM does not have the data item 00000000 and there is no unused slot, an approximate date item can be used to generate the output, as illustrated in FIG. 6. FIG. 6 illustrates another transformation to retime a register across a Read Only Memory (ROM) according to one embodiment of the present invention. For example, in FIG. 6, the ROM has an eight-bit data item 00000001 at the nine-bit address 010110010. The synthesis transformation 431 transforms the design 410 which has a register at the output side of the ROM 405 to the design 440 which has a register 453 at the input side of the ROM 441. The register 453 is configured to output a reset address 010110010 on the line 455, which causes the ROM 441 to output the data item 00000001 upon reset. To correct the data item 00000001 to 00000000, a flip flop 443 and an AND gate (457) are used. Upon reset, flip flop 443 generates 0, which forces the bit 0 (451) to zero, regardless the state of line 447 from the output of the ROM. The other bits (e.g., [7:1] of the data item 00000001) do not need correction. Thus, lines 451 and 449 produce the correct reset value. When the reset signal (407) is not on, the flip flop 443 outputs 1 (according to constant 445), which allows the signal on line 447 passes the AND gate (457) without modification. Thus, when the reset signal is not on, the lines 451 and 449 provides the data looked up from the ROM 441 without any modification.

FIG. 6 illustrates the use of a flip-flop and an AND gate for correcting the reset value from an approximate value looked up from the ROM. Other types of equivalent circuits can also be used. For example, the output of the flip-flop can be used on the selection line of a multiplexer to select either from the data on line 447 when the reset signal is not on or from a desired constant (e.g., 0) when the reset value is on.

Figure 7:
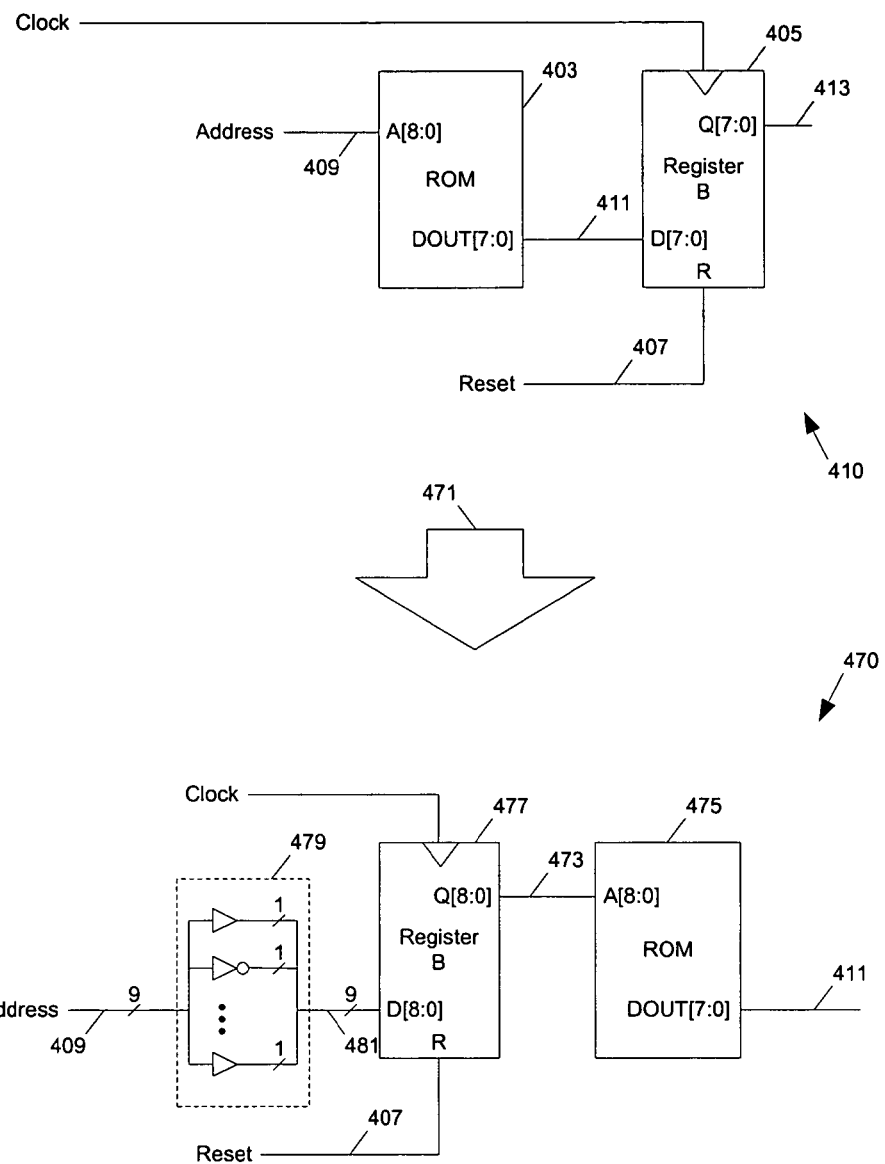
FIG. 7 illustrates a further transformation to retime a register across a Read Only Memory (ROM) according to one embodiment of the present invention.

FIG. 7 illustrates a further transformation to retime a register across a Read Only Memory (ROM) according to one embodiment of the present invention. In FIG. 7, the synthesis transformation 471 converts the circuit design 410 with a register 405 at the output side of the ROM 403 to the circuit design 470 with a register 477 at the input side of the ROM 475 with an address mapping circuit 479 in front of the register 477. In FIG. 7, the register 477 generates 000000000 upon reset on the line 473. At address 010110010 the original ROM 403 has a data item 00000000 which is equal to the reset value of the original register 413. In the transformed design 470, the data of the ROM is rearranged so that the data item 00000000 is at the address 000000000 of the ROM 475. Since the address mapping circuit 479 maps 010110010 to 00000000, the original address 010110010 applied on the address line 409 also causes the ROM 475 to output the same data item 00000000. One example of the address mapping circuit inverts bit 1, 4, 5 and 7 of bits [8:0] to generate the address on line 481 from the address on line 409. The data of the ROM is rearranged according to the address mapping circuit so that the same address applied on the line 409 causes the ROM 405 of design 410 and the ROM 475 of design 470 to output the same data item.

In general, the address mapping circuit is in the form of $A_2=M(A_1)$, where $A_1$ is the input address on line 409 and $A_2$ is the output address on line 481. If the original ROM is in the form of $D=R(A_1)$, where D is the data at the address $A_1$, the content of the ROM can be rearrange in the form of $D= R'(A_2)=R'(M(A_1))=R(A_1)$. The combination of the new ROM (R') and the address mapping circuit (M) is equivalent to the original ROM (R).

FIG. 7 illustrates the use of an address mapping circuit with a synthesis transformation of FIG. 5. The address mapping circuit can also be with the synthesis transformation of FIG. 6. FIG. 7 illustrates an address mapping circuit using a set of inverters. From this description, it is seen that other types of address mapping circuits can also be used so that the data can be rearranged in the ROM to have a particular data item addressed by the reset value of the register 477.

Figure 8:
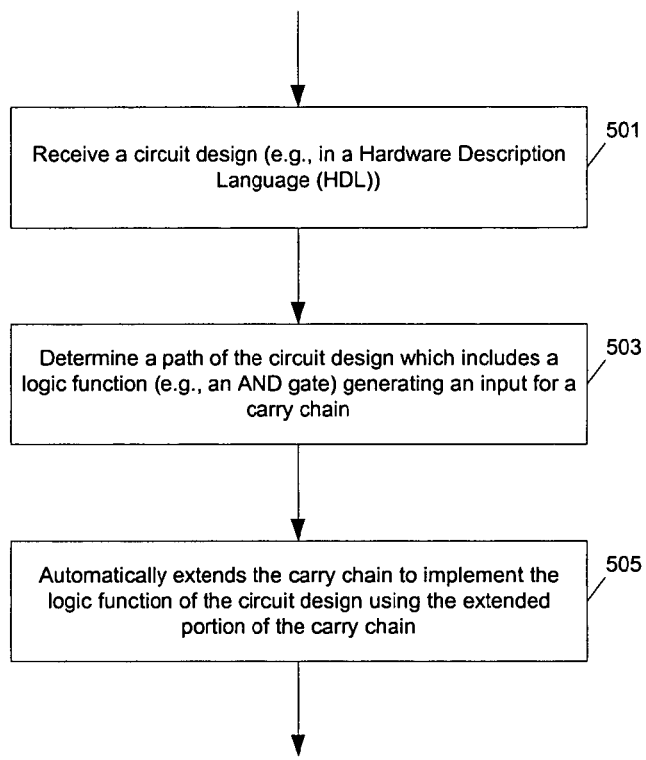
FIG. 8 shows a method to implement a logic function using an extended carry chain according to one embodiment of the present invention.

FIG. 8 shows a method to implement a logic function using an extended carry chain according to one embodiment of the present invention. After operation 501 receives a circuit design (e.g., in a Hardware Description Language (HDL)), operation 503 determines a path of the circuit design which includes a logic function (e.g., an AND gate) generating an input for a carry chain. Operation 505 automatically extends the carry chain to implement the logic function of the circuit design using the extended portion of the carry chain. For example, the logic function is implemented using a set of lookup table (LUT) units combined by the extended portion of the carry chain. In one implementation, the carry chain includes a chain of multiplexers selecting according to the output of the LUT units.

Figure 9:
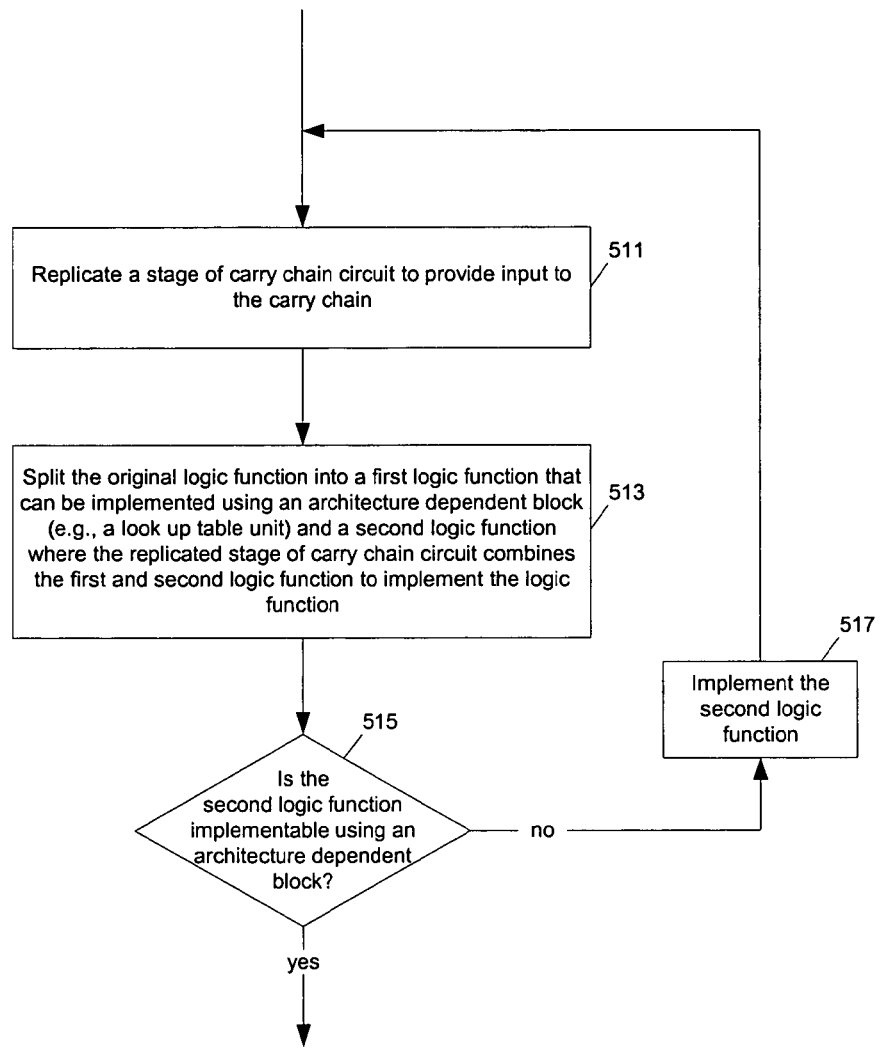
FIG. 9 shows a detail method to implement a logic function using an extended carry chain according to one embodiment of the present invention.

FIG. 9 shows a detail method to implement a logic function using an extended carry chain according to one embodiment of the present invention. Operation 511 replicates a stage of carry chain circuit to provide input to the carry chain. Operation 513 splits the original logic function into a first logic function that can be implemented using an architecture dependent block (e.g., a look up table unit) and a second logic function where the replicated stage of carry chain circuit combines the first and second logic function to implement the logic function. Operation 515 determines whether the second logic function is implementable using an architecture dependent block (e.g., a lookup table (LUT) unit). If not, operation 517 implements the second logic function through extending the carry chain for one more stage, until the original logic function is completely implemented using the architecture dependent blocks and the extended portion of the carry chain.

Figure 10:
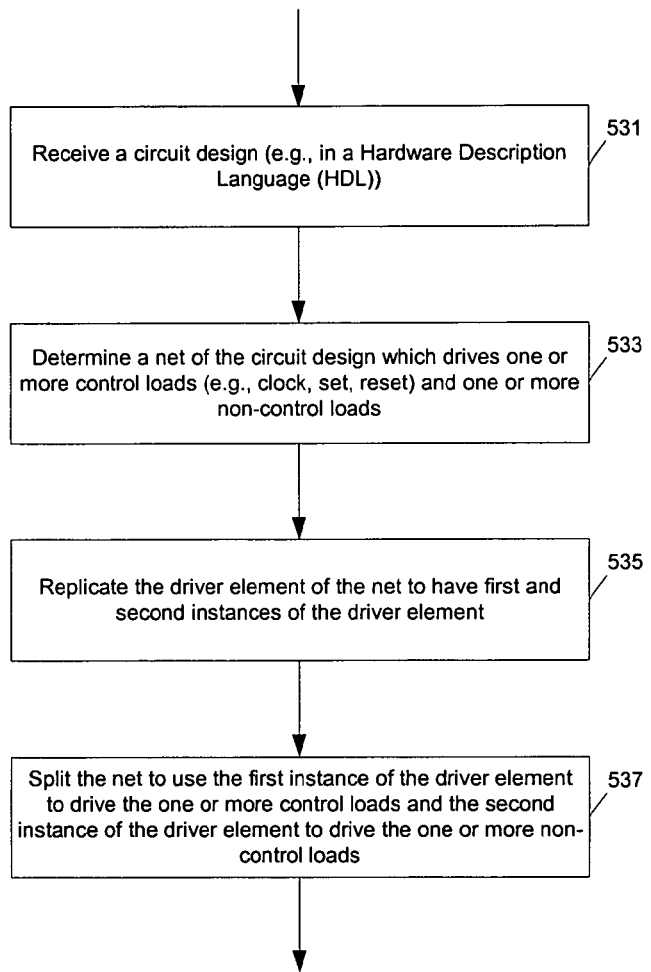
FIG. 10 shows a method to separate control loads and non-control loads according to one embodiment of the present invention.

FIG. 10 shows a method to separate control loads and non-control loads according to one embodiment of the present invention. After operation 531 receives a circuit design (e.g., in a Hardware Description Language (HDL)), operation 533 determines a net of the circuit design which drives one or more control loads (e.g., clock, set, reset) and one or more non-control loads. Operation 535 replicates the driver element of the net to have first and second instances of the driver element. Operation 537 splits the net to have the first instance of the driver element to drive the one or more control loads and the second instance of the driver element to drive the one or more non-control loads. In one embodiment, if a replication of the driver element already exists, operation 535 is not performed; the mixed loads are reconfigured for being driven by the driver element and the replicated driver element separately.

Figure 11:
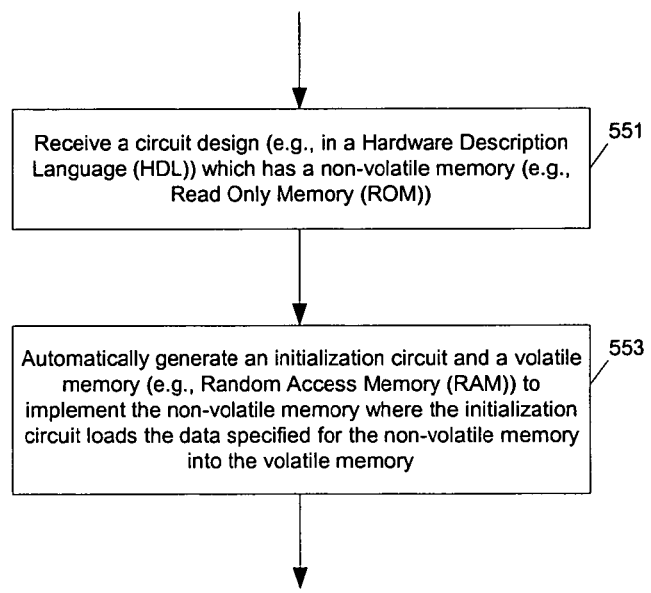
FIG. 11 shows a method to synthesize a Read Only Memory (ROM) according to one embodiment of the present invention.

FIG. 11 shows a method to synthesize a Read Only Memory (ROM) according to one embodiment of the present invention. After operation 551 receives a circuit design (e.g., in a Hardware Description Language (HDL)) which has a non-volatile memory (e.g., Read Only Memory (ROM)), operation 553 automatically generate an initialization circuit and a volatile memory (e.g., Random Access Memory (RAM)) to implement the non-volatile memory where the initialization circuit loads the data specified for the non-volatile memory into the volatile memory. The initialization circuit can be entirely hardware, or partically hardware partially software.

Figure 12:
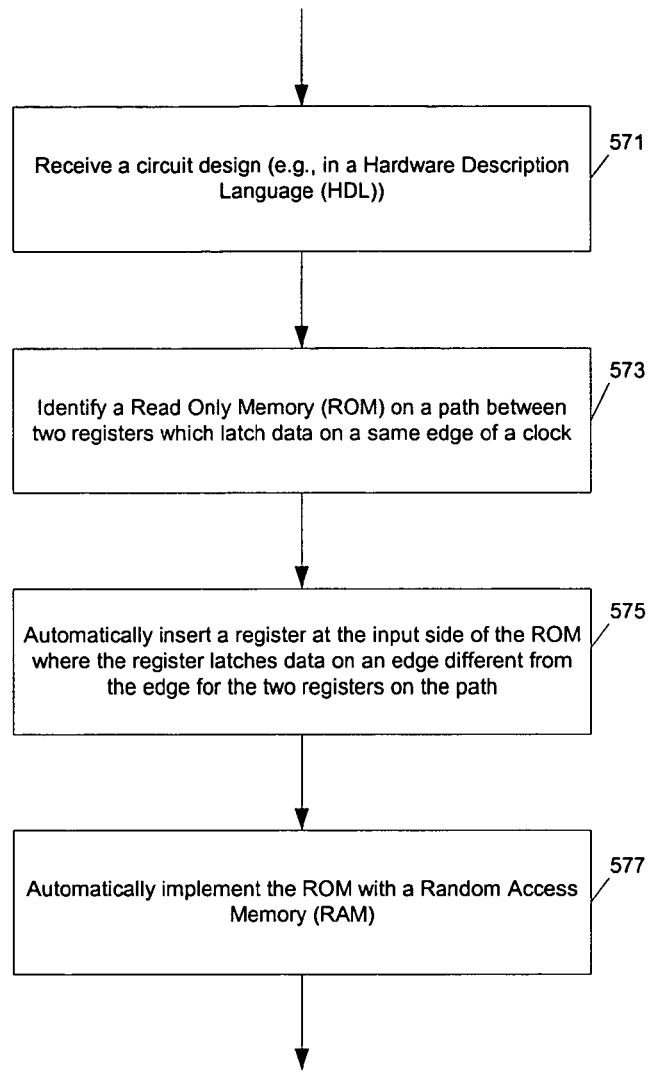
FIG. 12 shows a detailed method to synthesize a Read Only Memory (ROM) according to one embodiment of the present invention.

FIG. 12 shows a detailed method to synthesize a Read Only Memory (ROM) according to one embodiment of the present invention. After operation 571 receives a circuit design (e.g., in a Hardware Description Language (HDL)), operation 573 identifies a Read Only Memory (ROM) on a path between two registers which latch data on a same edge of a clock. Operation 575 automatically inserts a register at the input side of the ROM where the register latches data on an edge different from the edge for the two registers on the path. For example, the inserted register is controlled by a clock inverted from the clock that controls the two registers on the path. Operation 577 automatically implements the ROM with a Random Access Memory (RAM).

Figure 13:
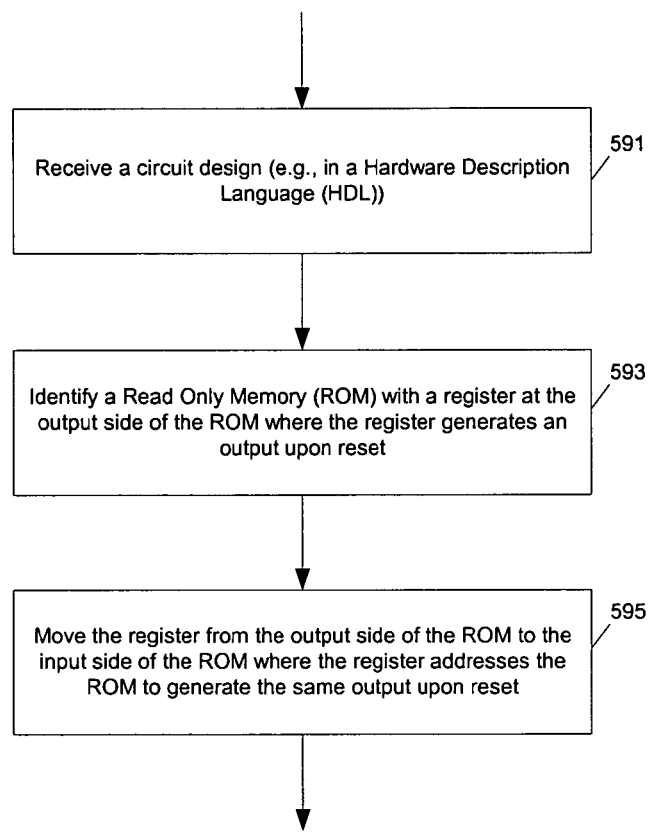
FIG. 13 shows another detailed method to synthesize a Read Only Memory (ROM) according to one embodiment of the present invention.

FIG. 13 shows another detailed method to synthesize a Read Only Memory (ROM) according to one embodiment of the present invention. Operation 591 receives a circuit design (e.g., in a Hardware Description Language (HDL)). Operation 593 identifies a Read Only Memory (ROM) with a register at the output side of the ROM where the register generates an output upon reset. Operation 595 moves the register from the output side of the ROM to the input side of the ROM where the register addresses the ROM to generate the same output upon reset.

Figure 14:
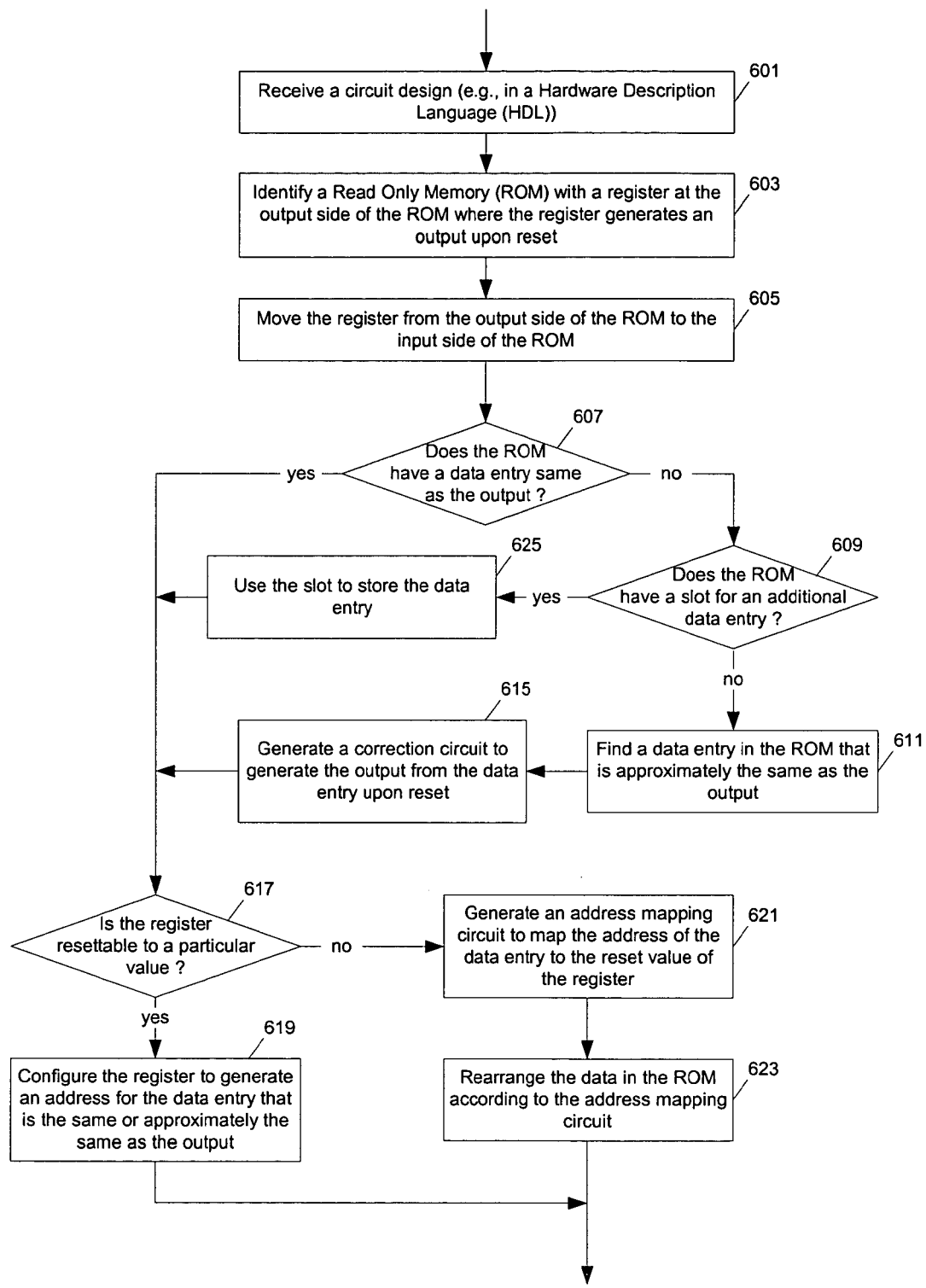
FIG. 14 shows a further detailed method to synthesize a Read Only Memory (ROM) according to one embodiment of the present invention.

FIG. 14 shows a further detailed method to synthesize a Read Only Memory (ROM) according to one embodiment of the present invention. After operation 601 receives a circuit design (e.g., in a Hardware Description Language (HDL)), operation 603 identifies a Read Only Memory (ROM) with a register at the output side of the ROM where the register generates an output upon reset. Operation 605 moves the register from the output side of the ROM to the input side of the ROM. Operation 607 determines whether the ROM have a data entry same as the output. If the ROM does not have a data entry same as the output, operation 609 determines whether the ROM have a slot for an additional data entry. If there is an unused slot in the ROM, operation 625 uses the slot to store the data item; otherwise, operation 611 finds a data entry in the ROM that is approximately the same as the output. Operation 615 generates a correction circuit to generate the output from the data entry upon reset. Operation 617 determines if the register is resettable to a particular value. If the register is resettable to any given value, operation 619 configures the register to generate an address for the data entry that is the same or approximately the same as the output. If the register is resettable to an arbitrary value, operation 621 generates an address mapping circuit to map the address of the data entry to the reset value of the register; and then operation 623 rearranges the data in the ROM according to the address mapping circuit. The combination of the address mapping circuit and the rearranged ROM looks up data in a way same as the original ROM (e.g., the same address looks up the same data).

In this description, it is understood that generating a circuit refers to generating a design representation (e.g., in terms of a hardware description language or netlist) of the circuit. The operations on a circuit design (e.g., moving a register, implementing a logic function, etc.) refer to the operations on a design representation of the circuit.

Many of the methods of the present invention may be performed with a digital processing system, such as a conventional, general-purpose computer system. Special purpose computers, which are designed or programmed to perform only one function, may also be used.

Figure 15:
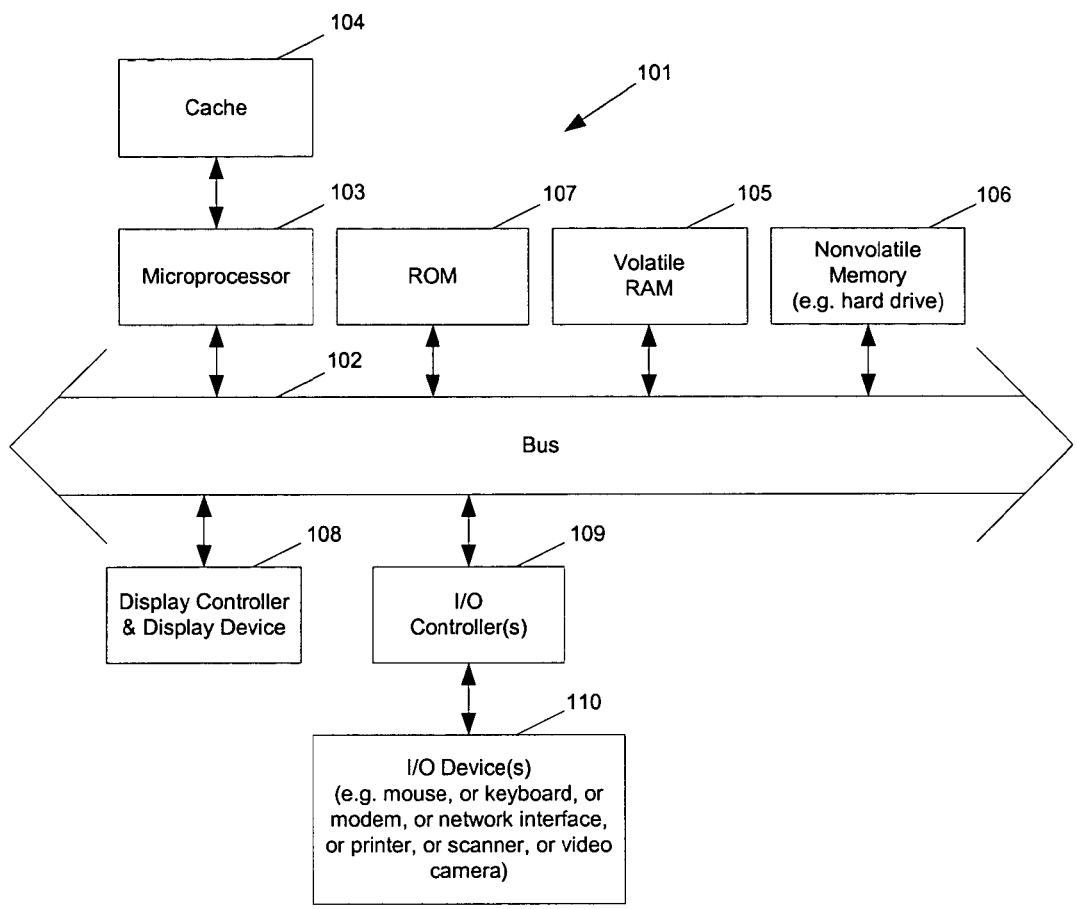
FIG. 15 shows a block diagram example of a data processing system which may be used with the present invention.

FIG. 15 shows one example of a typical computer system which may be used with the present invention. Note that while FIG. 15 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 15 may, for example, be a Sun workstation, or a personal computer (PC) running a Windows operating system, or an Apple Macintosh computer.

As shown in FIG. 15, the computer system 101, which is a form of a data processing system, includes a bus 102 which is coupled to a microprocessor 103 and a ROM 107 and volatile RAM 105 and a non-volatile memory 106. The microprocessor 103 is coupled to cache memory 104 as shown in the example of FIG. 15. The bus 102 interconnects these various components together and also interconnects these components 103, 107, 105, and 106 to a display controller and display device 108 and to peripheral devices such as input/output (I/O) devices which may be mice, keyboards, modems, network interfaces, printers, scanners, video cameras and other devices which are well known in the art. Typically, the input/output devices 110 are coupled to the system through input/output controllers 109. The volatile RAM 105 is typically implemented as dynamic RAM (DRAM) which requires power continually in order to refresh or maintain the data in the memory. The non-volatile memory 106 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 15 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 102 may include one or more buses connected to each other through various bridges, controllers and/or adapters as is well known in the art. In one embodiment the I/O controller 109 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 107, volatile RAM 105, non-volatile memory 106, cache 104 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 103.

A machine readable medium can be used to store software and data which when executed by a data processing system causes the system to perform various methods of the present invention. This executable software and data may be stored in various places including for example ROM 107, volatile RAM 105, non-volatile memory 106 and/or cache 104 as shown in FIG. 15. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.), as well as electrical, optical, acoustical or other forms of propagated signals (e.g., carrier waves, infrared signals, digital signals, etc.); etc.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method implemented on a data processing system for circuit synthesis, the method comprising:
   determining a Read Only Memory (ROM) of a design of a circuit, the ROM having predefined data when the circuit is initialized;
   automatically generating an initialization circuit and a Random Access Memory (RAM); and
   automatically inserting a first register at an input side of the ROM responsive to a determination that the ROM is between second and third registers, no register existing on a path between the second and third registers before the first register is inserted, the second and third registers latching data on a same edge of a clock signal, the first and second registers latching data on different edges of the clock signal, wherein the initialization circuit and the RAM are configured to implement the ROM, wherein the initialization circuit is configured to load the predefined data into the RAM when the circuit is initialized, and wherein at least one of the determining and automatically generating is performed by a processor.

2. The method of claim 1, wherein the first register and the ROM are implemented using the RAM.

3. A method implemented on a data processing system for circuit synthesis, the method comprising:
   determining a Read Only Memory (ROM) of a design of a circuit, the ROM having predefined data when the circuit is initialized;
   automatically generating an initialization circuit and a Random Access Memory (RAM); and
   removing a first register from an output side of the ROM and inserting a second register to an input side of the ROM, wherein the initialization circuit and the RAM are configured to implement the ROM, and wherein the initialization circuit is configured to load the predefined data into the RAM when the circuit is initialized, wherein at least one of the determining and automatically generating is performed by a processor.

4. The method of claim 3, wherein the first register outputs a first data entry upon reset; the method further comprises:
   identifying an address in the ROM; and
   configuring the second register to generate the address upon reset.

5. The method of claim 4, wherein the predefined data does not include the data item; the method further comprises:
   configuring the ROM to include the data item.

6. The method of claim 4, wherein the data item at the address in the ROM is approximately the same as the first data entry; the method further comprises:
   generating a circuit to correct the data item to the first data entry when the circuit is initialized.

7. The method of claim 3, wherein the second register generates a predefined value upon reset; the first register outputs a first data entry upon reset; the method further comprises:
   identifying a first address in the ROM, predefined data in the ROM having a second data entry at the first address;
   generating an address mapping circuit at an input side of the first register, the address mapping circuit mapping the first address to the predefined value;
   and
   rearranging the predefined data within the ROM according to the address mapping circuit, the second data entry being at an address of the predefined value in the rearranged predefined data in the ROM.

8. The method of claim 7, wherein the second data entry is one of:
   equal to the first data entry; or
   approximately equal to the first data entry, and the method further comprises generating a circuit to correct the second data entry to the first data entry when the circuit is initialized.

9. A method implemented on a data processing system for circuit synthesis, the method comprising:
   determining a Read Only Memory (ROM) of a design of a circuit, the ROM having predefined data when the circuit is initialized; and
   automatically generating an initialization circuit and a Random Access Memory (RAM), wherein the initialization circuit and the RAM are configured to implement the ROM, wherein the initialization circuit is configured to load the predefined data into the RAM when the circuit is initialized, and wherein the initialization circuit generates the predefined data by one of:
   a state machine to drive a circuit to generate the predefined data;
   the initialization circuit to load instructions to cause a processor to compute the predefined data for populating the RAM when the circuit is initialized.

10. A non-transitory machine readable medium containing executable computer program instructions which when executed by a digital processing system cause said system to perform a method for circuit synthesis, the method comprising:

determining a Read Only Memory (ROM) of a design of a circuit, the ROM having predefined data when the circuit is initialized; and automatically generating an initialization circuit and a Random Access Memory (RAM); and automatically inserting a first register at an input side of the ROM responsive to a determination that the ROM is between second and third registers, no register existing on a path between the second and third registers before the first register is inserted, the second and third registers latching data on a same edge of a clock signal, the first and second registers latching data on different edges of the clock signal, wherein the initialization circuit and the RAM are configured to implement the ROM, and wherein the initialization circuit is configured to load the predefined data into the RAM when the circuit is initialized.

11. The medium of claim 10, wherein the first register and the ROM are implemented using the RAM.

12. The medium of claim 10, wherein the second register generates a predefined value upon reset; the first register outputs a first data entry upon reset; the method further comprises:

identifying a first address in the ROM, predefined data in the ROM having a second data entry at the first address;

generating an address mapping circuit at an input side of the first register, the address mapping circuit mapping the first address to the predefined value;

and rearranging the predefined data within the ROM according to the address mapping circuit, the second data entry being at an address of the predefined value in the rearranged predefined data in the ROM.

13. The medium of claim 12, wherein the second data entry is approximately equal to the first data entry; the method further comprises:

generating a circuit to correct the second data entry to the first data entry when the circuit is initialized.

14. A data processing system for circuit synthesis, the data processing system comprising:

means for determining a Read Only Memory (ROM) of a design of a circuit, the ROM having predefined data when the circuit is initialized; and means for automatically generating an initialization circuit and a Random Access Memory (RAM); and means for automatically inserting a first register at an input side of the ROM responsive to a determination that the ROM is between second and third registers, no register existing on a path between the second and third registers before the first register is inserted, the second and third registers latching data on a same edge of a clock signal, the first and second registers latching data on different edges of the clock signal, wherein the initialization circuit and the RAM are configured to implement the ROM, and wherein the initialization circuit is configured to load the predefined data into the RAM when the circuit is initialized.

15. The data processing system of claim 14, wherein the first register outputs a first data entry upon reset; the data processing system further comprises:

means for identifying an address in the ROM; and means for configuring the second register to generate the address upon reset.

16. The data processing system of claim 14, wherein the second register generates a predefined value upon reset; the first register outputs a first data entry upon reset; the data processing system further comprises:

means for identifying a first address in the ROM, predefined data in the ROM having a second data entry at the first address;

means for generating an address mapping circuit at an input side of the first register, the address mapping circuit mapping the first address to the predefined value; and means for rearranging the predefined data within the ROM according to the address mapping circuit, the second data entry being at an address of the predefined value in the rearranged predefined data in the ROM.

17. A data processing system for circuit synthesis, the data processing system comprising:

means for determining a Read Only Memory (ROM) of a design of a circuit, the ROM having predefined data when the circuit is initialized; and means for automatically generating an initialization circuit and a Random Access Memory (RAM); and means for removing a first register from an output side of the ROM and inserting a second register to an input side of the ROM, wherein the initialization circuit and the RAM are configured to implement the ROM, and wherein the initialization circuit is configured to load the predefined data into the RAM when the circuit is initialized.

* * * * *